United States Patent
Zach et al.

(10) Patent No.: US 11,595,043 B2
(45) Date of Patent: Feb. 28, 2023

(54) METHOD FOR OPERATING AN APPLIANCE, DEVICE FOR PERFORMING THE METHOD, VEHICLE DOOR, AND COMPUTER PROGRAM

(71) Applicant: Volkswagen Aktiengesellschaft, Wolfsburg (DE)

(72) Inventors: Daniel Zach, Wolfsburg (DE); Dominik Ulrich, Wolfsburg (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 150 days.

(21) Appl. No.: 17/268,936

(22) PCT Filed: Aug. 12, 2019

(86) PCT No.: PCT/EP2019/071526
§ 371 (c)(1),
(2) Date: Feb. 16, 2021

(87) PCT Pub. No.: WO2020/035428
PCT Pub. Date: Feb. 20, 2020

(65) Prior Publication Data
US 2021/0305982 A1     Sep. 30, 2021

(30) Foreign Application Priority Data
Aug. 17, 2018   (DE) .......................... 102018213949.0

(51) Int. Cl.
*H03K 17/96* (2006.01)
*G06F 3/01* (2006.01)
*G08B 7/06* (2006.01)

(52) U.S. Cl.
CPC ........... *H03K 17/962* (2013.01); *G06F 3/016* (2013.01); *G08B 7/06* (2013.01); *H03K 2217/96062* (2013.01); *H03K 2217/960755* (2013.01)

(58) Field of Classification Search
CPC ....... H03K 17/962; H03K 2217/96062; H03K 2217/960705; H03K 2217/960755;
(Continued)

(56) References Cited

U.S. PATENT DOCUMENTS

2003/0080946 A1* 5/2003 Chuang ................. G06F 3/0488
345/173
2007/0257821 A1* 11/2007 Son ....................... G06F 3/0445
341/23
(Continued)

FOREIGN PATENT DOCUMENTS

DE      202007010570 U1     10/2007
DE      202011104758 U1     11/2011
(Continued)

OTHER PUBLICATIONS

NXP Semiconductors. AN11122 "Water and condensation safe touch sensing with the NXP capacitive touch sensors." Rev. 3 (Mar. 14, 2014).
(Continued)

*Primary Examiner* — Orlando Bousono
(74) *Attorney, Agent, or Firm* — Loza & Loza, LLP; Peter Zura

(57) ABSTRACT

Technologies and techniques for operating an appliance. A command button of an operating part is actuated, the actuation of the command button being detected by a microcontroller using measuring instruments. The read-in measured values are evaluated such that it is determined whether the measuring signal has a regular form for actuating the com-
(Continued)

mand button, or an irregular form. A function associated with the actuated command button is implemented if it is established that the measuring signal has a regular form. When a regular form is identified, optionally an acoustic, haptic or optical acknowledgement signal is emitted, and when an irregular form is identified, an acoustic, haptic or optical fault signal is emitted.

20 Claims, 4 Drawing Sheets

(58) Field of Classification Search
CPC ........ H03K 17/18; H03K 17/96; G06F 3/016; G06F 3/0487; G06F 3/0488; G06F 3/04883; G08B 7/06; B60R 25/20; B60R 25/2045; H04N 5/23203; B60H 1/0065
See application file for complete search history.

(56) References Cited

U.S. PATENT DOCUMENTS

| | | | |
|---|---|---|---|
| 2013/0076206 A1 | 3/2013 | Rosenberg et al. | |
| 2014/0232679 A1* | 8/2014 | Whitman | G06F 3/0414 345/173 |
| 2014/0354305 A1* | 12/2014 | Hanssen | H03K 17/955 324/661 |
| 2015/0144475 A1* | 5/2015 | Johnson | H03K 17/9622 200/600 |
| 2016/0378244 A1* | 12/2016 | Bandyopadhyay | G06F 1/1692 345/177 |
| 2017/0201254 A1* | 7/2017 | Hanssen | H03K 17/962 |
| 2017/0357403 A1* | 12/2017 | Geary | G06F 3/04883 |
| 2018/0013429 A1* | 1/2018 | Johnson | G01R 17/00 |

FOREIGN PATENT DOCUMENTS

| | | |
|---|---|---|
| DE | 102016221362 A1 | 5/2018 |
| EP | 3163751 A1 | 5/2017 |
| FR | 3045984 A1 | 6/2017 |
| JP | H04158121 A | 6/1992 |
| JP | 2012238152 A | 12/2012 |
| JP | 2014052752 A | 3/2014 |
| WO | 2011064551 A2 | 6/2011 |

OTHER PUBLICATIONS

McComb. "Capacitive mTouch sensing solutions." Design Guidelines. Microchip Technology Web Seminar. Microchip Technology, Inc. (2008).
NXP Semiconductors. "Proximity capacitive touch sensor controller." Product preview. MPR084 Capacitive Touch Sensor Controller. Rev. 6 (May 2010).
PCT/EP2019071526. International Search Report (dated Nov. 13, 2019).

* cited by examiner

METHOD FOR OPERATING AN APPLIANCE, DEVICE FOR PERFORMING THE METHOD, VEHICLE DOOR, AND COMPUTER PROGRAM

RELATED APPLICATIONS

The present application claims priority to International Pat. App. No. PCT/EP2018/071526 to Zach et al., filed Aug. 12, 2019, titled "Method for Operating an Appliance, Device for Performing the Method, Vehicle Door, and Computer Program", which claims priority to German Patent Application No. DE 10 2018 213 949.0 to Zach et al., filed Aug. 17, 2018, the contents of each being incorporated by reference in their entirety herein.

FIELD OF TECHNOLOGY

The present disclosure relates to technologies and techniques for operating a device. The device that is to be operated can be a component installed in a vehicle. It can also be a household appliance, such as a washing machine, refrigerator, dishwasher, oven, steamer, or stove. In particular, the device is a control panel that can be installed in a vehicle door. The present disclosure also relates to a device for executing the methods disclosed herein, a vehicle door in which the device for executing the method is installed, and a computer program.

BACKGROUND

Numerous electronic and electromechanical components are installed in the doors in modern vehicles, in particular the doors for the front passengers. These include electric locks, window and side-view mirror motors, airbag pressure sensors for side impact protection, one or more digital cameras for environment observation, lights for exterior and interior (ambient) lighting, and speakers.

Some of these components can be operated by the vehicle occupants. Control units with "touch functions" may be used in the future for this. There are numerous buttons in the control unit that are touch-sensitive. Capacitive sensor buttons can be used for this, for example.

These sensor buttons can malfunction due to external influences, such that the user is no longer able to select a specific function. One example of this is user error, for example, touching the buttons with multiple fingers or at an undefined location. The switch signal is then unclear, and does not result in triggering a function.

The control unit can become wet, for example, due to rain. This can lead to a sensor malfunction, which likewise results in no function being triggered. Other external influences can be: moisture due to snowfall, fog, spilled beverages, applications of creams, or impairments due to objects, body parts, etc. coming in contact therewith.

The reason for the malfunction may include the following: If the buttons on the control unit becomes wet, or multiple buttons are actuated multiple times in an undefined manner, a "capacitive short circuit" occurs, such that the buttons no longer function. The moisture must first be removed (e.g. by wiping), before the control unit can resume functioning.

A remote control for a bathtub is known from JP-A-Hß4158121, which has numerous control buttons. If a button is pushed to fill the bathtub with hot water when the hot water source is blocked (deactivated), the hot water supply is automatically blocked and a buzzer is actuated three times. Furthermore, an associated display LED blinks three times.

SUMMARY

An aspect of present disclosure is to simplify the operation of control units that may be exposed to strenuous operating conditions. In particular, feedback regarding the state of the control unit should be supplied to the user when operating touch-sensitive control units.

In some examples, technologies and techniques are disclosed for operating an appliance in which a button in a control unit is actuated in order to operating the appliance. The actuation of the button is detected by a processor using measurement technology. The input measurement value may then be evaluated. The evaluation may take place such that it is determined whether the measurement signal has a regular or irregular form for the actuation of the button. If it is determined that the measurement signal has a regular form, the function assigned to the button is carried out. If a regular form is identified, an optional acoustic, haptic, or optical actuation signal may be output, or two or more of these signals may be simultaneously output, and if an irregular form is identified, an acoustic, haptic, or optical error signal is output, or two or more of these error signals are output. In this manner, it is indicated to the user that the control element is temporarily not functioning. An error signal indicates that the control unit is malfunctioning, and that moisture must be removed, for example, to restore proper functioning. As a result, the user will not have to visit a garage to inquire about the cause of the malfunctioning. In addition to the intuitive understanding of the confirmation signal and error signal, the respective meanings thereof are described in the user manual for the control.

In some examples, an error signal may be configured with a unique characteristic. In a simple variation, a confirmation sound is output as the acoustic confirmation signal, and a distorted confirmation sound is output as the error signal. This provides the user with easily understood feedback regarding the state of the control. It is particularly advantageous that the user does not ever need to see the control unit to receive the feedback. Acoustic, haptic and optical error signals can be combined freely or used individually.

In an alternative embodiment, an optical confirmation signal may be output. For this, a light source may be lit up continuously for a certain period of time, and to form an error signal, the light source blinks for a certain period of time.

In another variation, an optical confirmation signal is formed by continuous lighting in a first color for a certain period of time, and the error signal may be formed by continuous lighting or blinking in a second color for a certain period of time. This coloration results in an improved feedback (e.g. green when functioning properly, and yellow when temporarily malfunctioning).

In an alternative embodiment, an acoustic error signal may be output continuously, or for a certain period of time.

A In some examples, a device may be configured for executing the techniques disclosed herein and may include at least one processor that is configured to carry out the functions described herein, aside from physically actuating the buttons.

In some examples, the device may be configured to include a control unit and an acoustic, haptic, or optical signal output, via which the optional confirmation signal and the error signal are output. A combination of two or more of these signal generators can also be used. The control unit may include a number of buttons for operating the appliance, which generate a characteristic switch signal when they are actuated. The buttons can be formed by touch-sensitive capacitive sensor buttons.

In some examples, a microcomputer is used as the processor. The microcomputer may be equipped with means such as an A/D converter, and a timer, which are necessary for detecting the actuation of a button using measurement technology.

The device as disclosed herein may include at least one optical signal generator in the form of a light emitting diode (LED). Light emitting diodes are not sensitive to mechanical vibrations, extremely durable, and use little energy.

In some examples, the device may be configured with at least two optical signal generators in the form of light emitting diodes of different colors. This provides for the improved optical feedback option described above.

The optical, haptic, or acoustic signal generator may be configured as part of the control unit. As a result, the feedback comes directly from where the button is actuated.

The device as disclosed herein may be configured to be used in a vehicle. The control unit is used therein to operate door components such as window motors, locks and side-view mirrors. When the door or window is open, the control unit may become wet, for example, due to rain, snowfall, or fog.

In some examples, the acoustic signal generator may be configured as a speaker built into the vehicle door. Speakers are usually installed in vehicle doors. In this case, the signal generator does not need to be part of the control. This can result in lower costs.

The audio system for the vehicle may be used to generate the acoustic feedback.

In some examples, the processor may include a bus interface that sends a message to a door control unit including a command to output the acoustic confirmation signal or the acoustic error signal. The control unit may be connected to the door control unit via a local interconnect network (LIN) bus. The door control unit generates the corresponding sounds and outputs them at the speakers.

Some of the advantages disclosed herein may also apply accordingly to a computer program containing program code, that executes the functions disclosed according to the present disclosure when the code is processed in a processor.

BRIEF DESCRIPTION OF THE DRAWINGS

A number of exemplary embodiments of the present disclosure are shown in the drawings and shall be explained below in greater detail in reference to the figures.

Therein.

DETAILED DESCRIPTION

The present description illustrates the principles of the disclosure according to the present disclosure. It should be understood that persons skilled in the art are capable of conceiving of various arrangements that are not described explicitly herein, that still embody the principles of the disclosure, and should likewise be protected in their scope.

Figure 1:
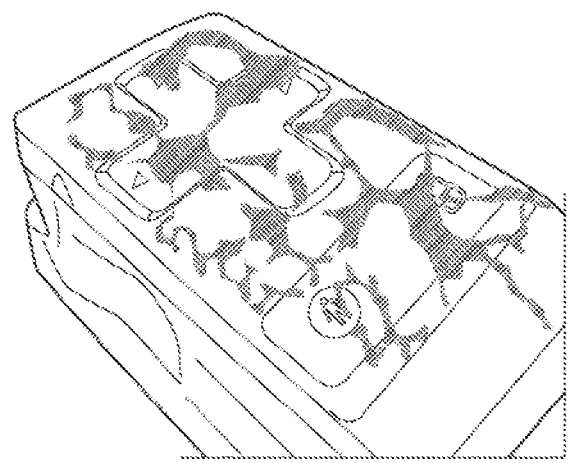
FIG. 1 shows a simplified control unit with numerous buttons for operating components in a vehicle door, according to some aspects of the present disclosure.

FIG. 1 shows a control element installed in a vehicle door for operating components. This can be the vehicle door in any vehicle. Typically, it is used in a vehicle door on a passenger motor vehicle. Any other vehicle can also be used. Examples of other vehicles are: bicycles, motorcycles, busses, utility vehicles, in particular trucks, agricultural machines, construction machines, rail vehicles, etc. The present disclosure can be used in general with land vehicles, including robots, rail vehicles, boats and aircraft, including drones.

FIG. 1 shows an illustrative real-world scenario in which the control unit becomes wet due to rain or, e.g. snow that collects inside the vehicle after the door covered in snow is opened.

In this example, the control panel may include 10 buttons for operating, e.g., window motors, side-view mirrors and the door locking system. It may also include light sources for lighting the control panel. LEDs may be used for this, under some examples. The buttons may be formed by capacitive sensors that output a specific measurement signal when touched.

Figure 2:
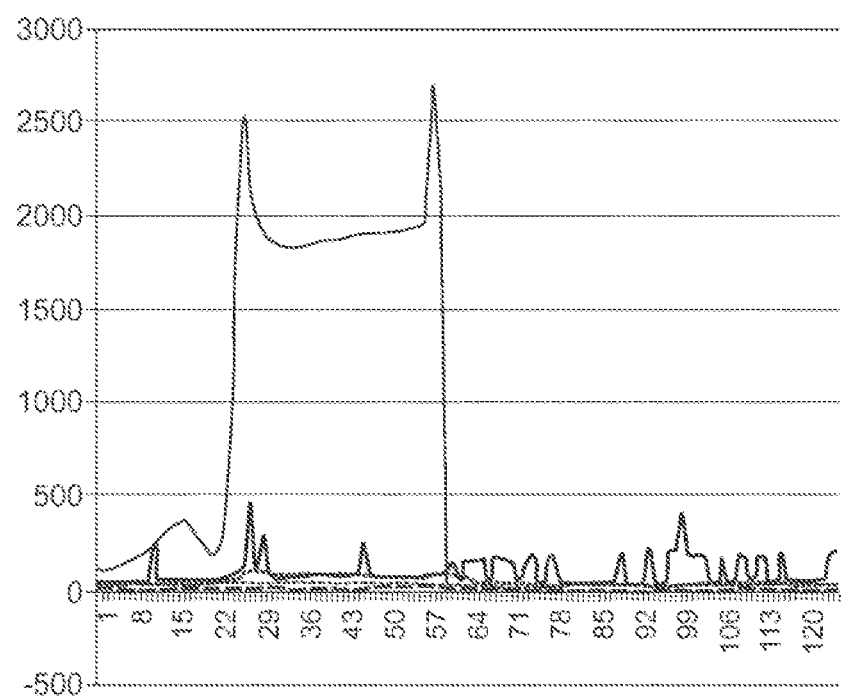
FIG. 2 shows an illustrative signal curve when actuating a button in the control unit when it is dry, according to some aspects of the present disclosure.

FIG. 2 shows a clean measurement signal, when just one of the buttons is touched. In this example, time is plotted along the x-axis in milliseconds. The capacitance values are plotted in pF along the y-axis. The clean measurement signal has roughly the form of a square wave signal, but with two signal peaks, one at the start of the signal, and the other at the end of the signal. With this signal curve, only the actuated button is active, and all of the other signals indicate inactivity of the corresponding buttons.

Figure 3:
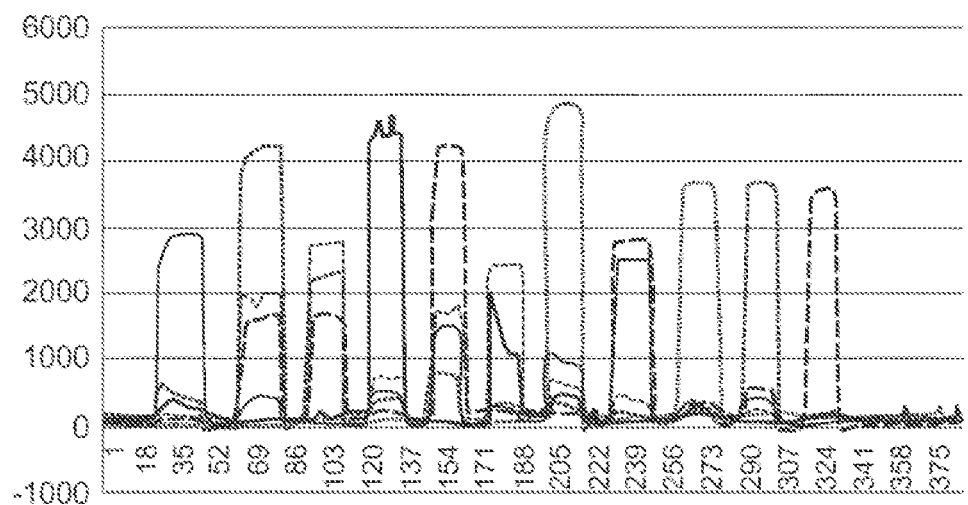
FIG. 3 shows an illustrative signal curve when actuation a button in the control unit when it is wet, according to some aspects of the present disclosure.

FIG. 3 shows an example of a measurement signal distorted by moisture. When a wet button is touched, the capacitance values that are measured are altered. At the same time, the capacitance values of the other buttons are also altered, such that it may be the case that when one button is touched, other buttons also respond, and a measurement signal is output by the measurement. FIG. 3 shows that numerous buttons respond repeatedly, successively. This is a "capacitive short circuit." The measurement signal identified in the measurement interval looks entirely different from that in FIG. 2.

Figure 4:
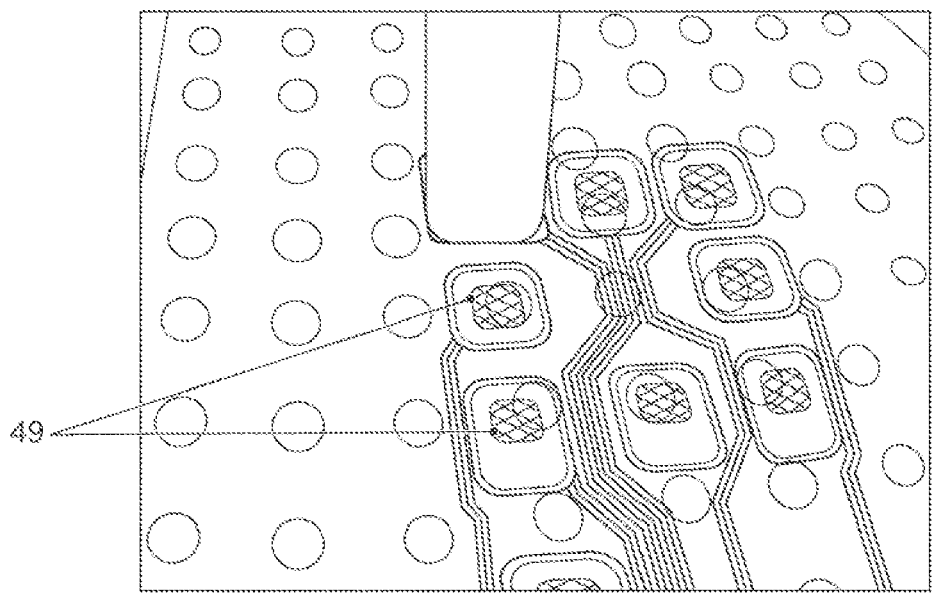
FIG. 4 shows an internal structure of the control unit with the various buttons, wherein a test with water droplets is carried out, according to some aspects of the present disclosure.

FIG. 4 shows the internal structure of the operating element. The buttons and conductor paths for connecting the buttons are shown. The buttons are configured for a capacitive measurement of touch. The buttons comprise an outer metal border and a number of crossing conductor paths in the interior. In this test construction, a perforated plastic plate is placed on the buttons. A water droplet can be placed on a perforation, to test how the respective button reacts to moisture.

Figure 5:
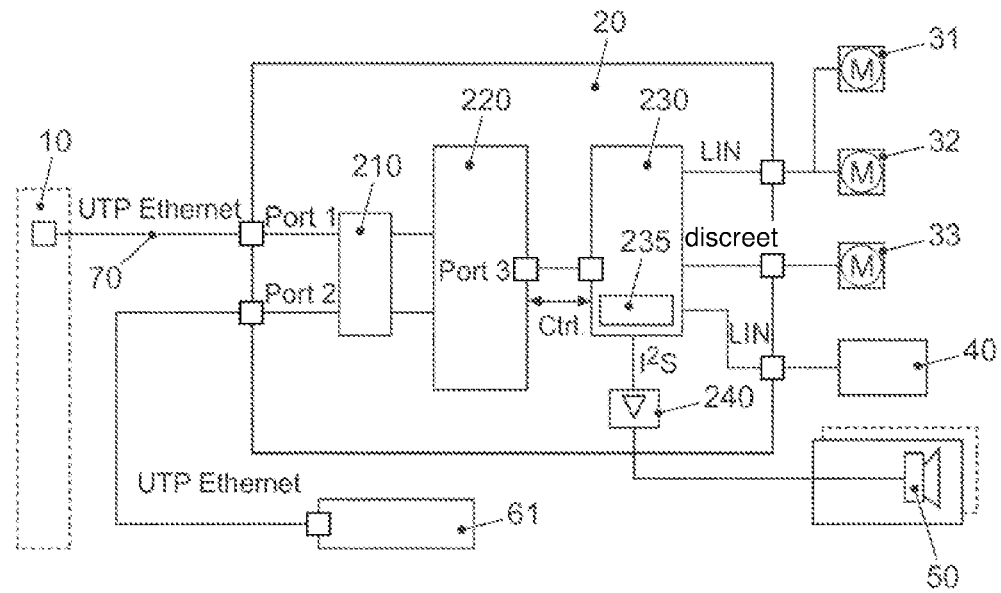
FIG. 5 shows a simplified block diagram of a door control unit and its connection to peripheral door components, according to some aspects of the present disclosure.

FIG. 5 shows a simplified block diagram of a door control unit. The door control unit may be configured for use in a vehicle door. Reference symbol 10 in FIG. 5 indicates a so-called door joint. The conductors in this example are guided therein from a central vehicle body control unit (not shown) to the door components. All of the conductors may be bundled into a connector unit in the door. Another connector unit may be incorporated in the vehicle body. When the door is installed on the vehicle body, both of the connector units may be connected with set of cables, coated with a rubber sleeve, such that the connections, connector units, and cables are protected (not shown).

The door control unit has the reference symbol 20. The following door components may be connected to the door control unit 20 in this example: a number of electric motors forming actuators 31, 32, 33. Reference symbol 31 indicates an electric motor for a rear-view mirror. Reference symbol 32 indicates a window motor, and reference symbol 33 indicates a door locking system motor. Other door components connected thereto are a control unit 40, which is used to operate window motors, rear-view mirrors, and the door locking system. The control unit 40 is formed by a keypad with buttons, see FIGS. 1 and 4. Another control unit may also be connected thereto. One or more speakers 50 may be connected thereto. Another door component connected thereto is a digital camera 61. This can be a simple video camera. It can be installed, for example, in the side-view mirror housing. It is used there to provide images for monitoring to the side of the vehicle. Other door components can also be connected thereto (not shown). These could be, for example, numerous lighting units for interior or exterior lighting, or a second digital camera for viewing traffic toward the rear (rear-view camera).

Examples of a structure of the door control unit 20 are explained below, and may include the following components: microcontroller 230, Ethernet interface (PHY) 210, Ethernet switch 220, and class D amplifier module 240. The amplifier module 240 may include as many class D amplifiers as there are speakers to be connected thereto.

The Ethernet interface 210 may be configured as a variation on Automotive Ethernet. An exemplary Ethernet variation includes "BroadR-Reach" technology. The BroadR-Reach Ethernet Physical Layer standard for the automotive industry can be combined with Ethernet-Switch technology according to the IEEE 802.3 standard, resulting in a transfer rate of 100 Mbit/sec over unshielded single-twisted cable pairs. The Automotive Ethernet may be configured to function in a full duplex mode, where data are transferred back and forth simultaneously via a twisted two-wire conductor. The wiring in this variation of the Ethernet bus system in this example is relatively simple. The Ethernet interface 210 may be configured with two ports. The Ethernet cable may be connected to Port 1, which leads to the door joint 10. The digital camera 61 may be connected to Port 2. The data for all of the door components is transferred to the Ethernet switch 220 via Port 1. These data are typically supplied by the vehicle body control unit. The Ethernet switch 220 distributes the data packet to its output ports. In the example shown in FIG. 1, the data packets for operating the digital camera 61 are forwarded to Port 2. The data packets for other door components are forwarded to the output port (Port 3), to which the microcontroller 230 is connected. The further distribution to the door components takes place inside the microcontroller 230. The distribution of the data packets in the Ethernet switch 220 may be based on the evaluation of the MAC addresses in the data packets assigned to the individual ports.

A gateway 235 may be included in the microcontroller 230 for the audio data intended for the speakers 50 that is used to implement the audio data packets transmitted via IP protocol. The transport protocol used for the audio streaming for this example may correspond to the RTP protocol, "Real Time Transport Protocol." The RTCP protocol is used for controlling this audio streaming, i.e. "Real Time Control Protocol." The audio data are transferred to the digital amplifier module 240 via an inter-IC sound bus $I^2S$. The gateway 235 reformats the data packets from the RTP format into the $I^2S$ format. The digital amplifier module 240 also contains the necessary D/A converter, to convert the extracted audio data back into an analog audio signal, which is then amplified with the digital amplifier 240.

The microcontroller 230 may be configured to convert the data for activating the electric motors 31 and 32 into the format for the LIN bus, i.e. Local Interconnect Network bus, via which the electric motors 31, 32 are connected to the door control unit 20. Reference is made here to the corresponding documentation for industry standards.

The control data for controlling the door locking system mechanism may be processed directly by the microcontroller 235, and discreet signals are generated that activate the electric motor 33.

Figure 6:
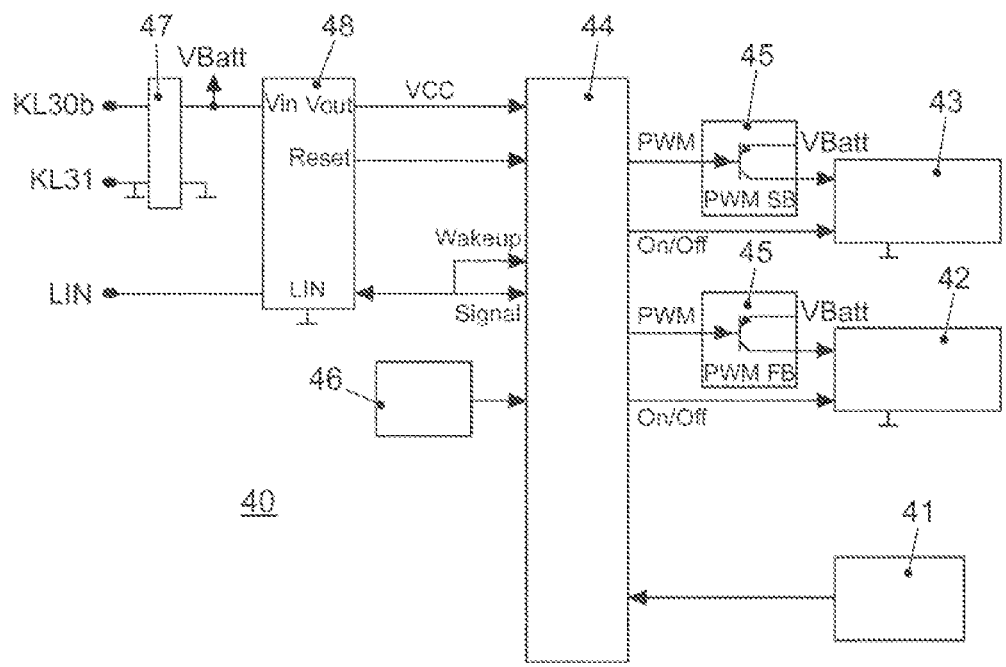
FIG. 6 shows a simplified block diagram of a control unit for operating components in a vehicle door, according to some aspects of the present disclosure.

FIG. 6 shows a block diagram of the control unit 40 under some examples. The control unit 40 includes an assembly 41 of capacitive buttons. Another main component of the control element may include a microcontroller 44. The microcontroller 44 is provided with electricity via an input fuse 47 and a power supply 48. The power supply may also include a bus connection circuit that connects the control unit 40 to the LIN bus, which connects the control 40 to the door control unit 20. A measurement unit 46 is also shown, with which ambient brightness is measured, which is then used to adjust the lighting. The microcontroller 44 has numerous output connections to various light sources. The light sources may be configured as energy-saving LEDs. LED 43 is a searchlight in the form of a white LED. LED 42 is used for function lighting, and is tinted (green, yellow). A PWM conversion unit 45 is connected upstream of each of the respective LEDs 42, 43, which amplifies the PWM signal output by the microcontroller 44 for adjusting the brightness of the searchlight and function lights.

Figure 7:
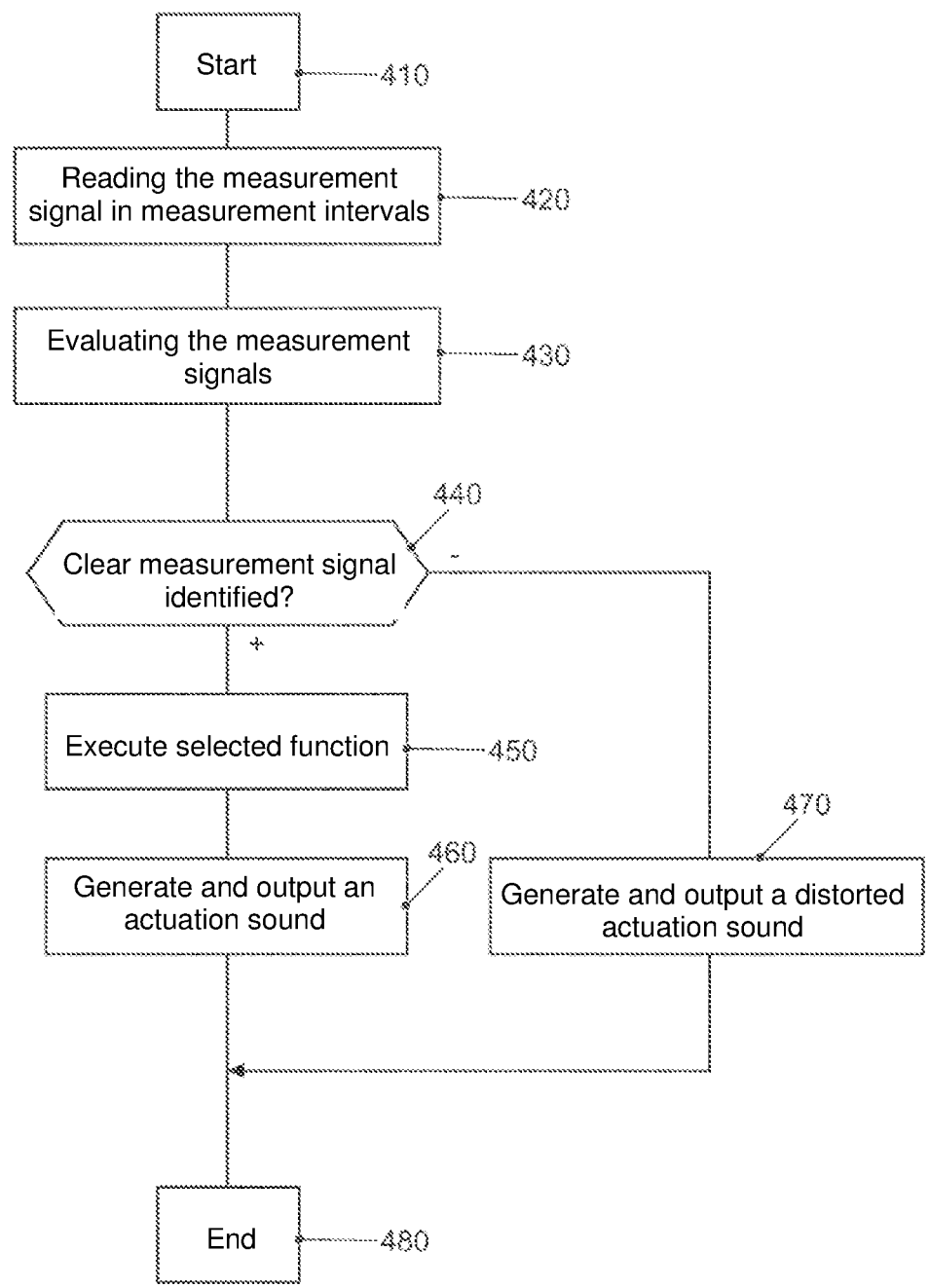
FIG. 7 shows an illustrative flow chart for a program that is process in the microcontroller for the control, according to some aspects of the present disclosure.

The functioning of the control unit 40 in response to malfunctions caused by moisture shall be explained in greater detail below. A computer program is processed by the microcontroller 44 for this, which may be configured to function in the manner described by the flow chart in FIG. 7. This program is periodically called on by the microcontroller 44 to read the measurement signals in a measurement interval. This takes place through the use of one A/D converter for each button. The program is called on in step 410 through an interrupt, which is periodically generated by a timer. The timer can be part of the microcontroller 44. The measurements for the measurement signals generated by the buttons are read in program step 420.

The measurements are evaluated in program step 430. The images shown in FIG. 2 and FIG. 3 are generated if moisture is present. In this manner, it is determined which button has been normally actuated. This is stored in a register. If a distorted signal is then recorded, as shown in FIG. 3, a corresponding entry is made in the register, indicating that a clear measurement signal was not recorded.

The register is then checked in query 440 regarding whether a clear measurement signal has been identified or not. If yes, the desired function is carried out in step 450. The function linked to the register entry is then carried out. A confirmation sound may then be generated and output in step 460. The confirmation sound is output via the speaker 50, see FIG. 5. If a clear measurement signal is not identified, the program branches in query 440 to program step 470. An error sound may be generated and output therein. This sound informs the operator not of a user error, but rather, that the control unit has malfunctioned. The program ends in step 480 after executing one of the two steps 460, 470. The error sound can be output in the form of a distorted confirmation sound. It can also be some other sound that has no direct relationship to the confirmation sound.

In another embodiment, the green LED 42 is lit for a certain time period in program step 460, as a confirmation that a clear measurement signal has been identified. The yellow LED 42 then blinks for a certain time period in program step 470 in order to indicate to the operator that the control unit 40 is malfunctioning.

Depending on the embodiment, an acoustic or optical feedback can therefore be output. In another embodiment, both the acoustic and the optic feedback can be output. In another embodiment, the acoustic signal generator is part of the control unit 40.

The disclosure is not limited to the exemplary embodiments described herein. There is room for various adjustments and modifications, that the person skilling in the art would consider on the basis of his expert knowledge as well as belonging to the disclosure.

LIST OF REFERENCE SYMBOLS

- 10 door joint
- 20 door control unit
- 31 mirror motor actuator
- 32 window motor actuator
- 33 locking system actuator
- 40 control
- 41 button assembly
- 42 optical signal generator
- 43 optical signal generator
- 44 microcontroller
- 45 PWM converter
- 46 brightness sensor
- 47 fuse
- 48 power supply
- 49 buttons
- 50 speaker
- 61 digital camera
- 70 Ethernet communication bus
- 210 first Ethernet interface
- 215 second Ethernet interface
- 220 Ethernet switch
- 230 microcontroller
- 235 gateway
- 240 digital amplifier
- 410 —
- 480 various computer program steps

The invention claimed is:

1. A method for operating a device, comprising:
    detecting, via a measurement device, an input measurement signal associated with an actuation of a button on a control unit, the button being configured to actuate a function of the device;
    evaluating, via the measurement device, the input measurement signal to determine if the input measurement signal comprises a regular or irregular form for the actuation of the button wherein the regular form comprises a waveform shape, and the irregular form comprises a distortion of the waveform shape, indicating a short-circuit;
    actuating the function of the device if the evaluating determines the input measurement signal comprises a regular form; and
    generating at least one of an acoustic, haptic or optical error signal if the evaluating determines the input measurement signal comprises the irregular form.

2. The method of claim 1, wherein evaluating the input measurement signal comprises measuring capacitive values of the input measurement signal.

3. The method of claim 2, wherein the regular form comprises a square waveform shape, and the irregular form comprises a distortion of the square waveform shape.

4. The method of claim 1, further comprising generating at least one of an acoustic, haptic or optical confirmation signal if the evaluating determines the input measurement signal comprises a regular form.

5. The method of claim 4, wherein generating the confirmation signal comprises generating an acoustic confirmation signal, and generating the error signal comprises generating a distorted acoustic confirmation signal.

6. The method of claim 4, wherein generating the confirmation signal comprises continuously illuminating a light source continuously for a configured period of time, and wherein generating the error signal comprises illuminating the light source intermittently for a configured period of time.

7. The method of claim 4, wherein generating the confirmation signal comprises continuously illuminating a light source of a first color continuously for a configured period of time, and wherein generating the error signal comprises illuminating a light source of a second color intermittently for a configured period of time.

8. A device for a vehicle, comprising:
    a control unit, configured to activate a function on the vehicle;
    a button configured to activate the control unit; and
    a measurement device, wherein the control unit and measurement device are configured to
    detect an input measurement signal associated with an actuation of the button on the control unit, the button being configured to actuate a function of the device;
    evaluate the input measurement signal to determine if the input measurement signal comprises a regular or irregular form for the actuation of the button, wherein the regular form comprises a waveform shape, and the irregular form comprises a distortion of the waveform shape, indicating a short-circuit;
    actuate the function of the device if the evaluating determines the input measurement signal comprises a regular form; and
    generate at least one of an acoustic, haptic or optical error signal if the evaluating determines the input measurement signal comprises the irregular form.

9. The device of claim 8, wherein the control unit and measurement device are configured to evaluate the input measurement signal by measuring capacitive values of the input measurement signal.

10. The device of claim 9, wherein the regular form comprises a square waveform shape, and the irregular form comprises a distortion of the square waveform shape.

11. The device of claim 8, wherein the control unit and measurement device are configured to generate at least one of an acoustic, haptic or optical confirmation signal if the evaluating determines the input measurement signal comprises a regular form.

12. The device of claim 11, wherein the control unit and measurement device are configured to generate the confirmation signal by generating an acoustic confirmation signal, and generating the error signal comprises generating a distorted acoustic confirmation signal.

13. The device of claim 11, wherein the control unit and measurement device are configured to generate the confirmation signal by continuously illuminating a light source continuously for a configured period of time, and wherein generating the error signal comprises illuminating the light source intermittently for a configured period of time.

14. The device of claim 11, wherein generating the confirmation signal comprises continuously illuminating a light source of a first color continuously for a configured period of time, and wherein generating the error signal comprises illuminating a light source of a second color intermittently for a configured period of time.

15. A method for operating a device, comprising:
    detecting, via a measurement device, an input measurement signal associated with an actuation of a button on a control unit, the button being configured to actuate a function of the device;
    evaluating, via the measurement device, the input measurement signal by measuring capacitive values to determine if the input measurement signal comprises a regular or irregular form for the actuation of the button;
    actuating the function of the device if the evaluating determines the input measurement signal comprises a regular form, wherein the regular form comprises a waveform shape, and the irregular form comprises a distortion of the waveform shape, indicating a short-circuit; and
    generating at least one of an acoustic, haptic or optical error signal if the evaluating determines the input measurement signal comprises the irregular form.

16. The method of claim 15, wherein the regular form comprises a square waveform shape, and the irregular form comprises a distortion of the square waveform shape.

17. The method of claim 15, further comprising generating at least one of an acoustic, haptic or optical confirmation signal if the evaluating determines the input measurement signal comprises a regular form.

18. The method of claim 17, wherein generating the confirmation signal comprises generating an acoustic confirmation signal, and generating the error signal comprises generating a distorted acoustic confirmation signal.

19. The method of claim 17, wherein generating the confirmation signal comprises continuously illuminating a light source continuously for a configured period of time, and wherein generating the error signal comprises illuminating the light source intermittently for a configured period of time.

20. The method of claim 17, wherein generating the confirmation signal comprises continuously illuminating a light source of a first color continuously for a configured period of time, and wherein generating the error signal comprises illuminating a light source of a second color intermittently for a configured period of time.

* * * * *